US012701832B2

(12) United States Patent
Low et al.

(10) Patent No.: US 12,701,832 B2
(45) Date of Patent: Aug. 4, 2026

(54) LIGHTING SYSTEMS AND ASSOCIATED METHODS OF COMBINING VISIBLE AND NON-VISIBLE LIGHT CONVERTING PHOSPHOR

(71) Applicant: Dominant Opto Technologies Sdn Bhd., Melaka (MY)

(72) Inventors: Tek Beng Low, Melaka (MY); Eng Wah Tan, Melaka (MY); Chee Sheng Lim, Melaka (MY)

(73) Assignee: DOMINANT OPTO TECHNOLOGIES SDN BHD., Melaka (MY)

( * ) Notice: Subject to any disclaimer, the term of this patent is extended or adjusted under 35 U.S.C. 154(b) by 399 days.

(21) Appl. No.: 18/404,505

(22) Filed: Jan. 4, 2024

(65) Prior Publication Data

US 2024/0136478 A1    Apr. 25, 2024
US 2024/0234647 A9    Jul. 11, 2024

Related U.S. Application Data

(60) Continuation-in-part of application No. 17/891,965, filed on Aug. 19, 2022, now abandoned, which is a
(Continued)

(51) Int. Cl.
*H10H 20/851*        (2025.01)
(52) U.S. Cl.
CPC ............................. *H10H 20/8512* (2025.01)
(58) Field of Classification Search
None
See application file for complete search history.

(56) References Cited

U.S. PATENT DOCUMENTS 6,744,077 B2    6/2004    Trottier et al.
6,762,551 B2    7/2004    Shiiki et al.
(Continued)

FOREIGN PATENT DOCUMENTS

WO    2011/069177    6/2011

OTHER PUBLICATIONS

Office Action mailed Apr. 23, 2018 for U.S. Appl. No. 15/797,843, 15 pages.
(Continued)

*Primary Examiner* — Daniel Whalen
(74) *Attorney, Agent, or Firm* — Amin, Turocy & Watson, LLP

(57)        ABSTRACT

Lighting systems and methods of combining visible and non-visible light converting phosphor are presented herein. A method comprises varying respective amounts of a non-visible light converting phosphor and respective amounts of a visible light converting phosphor that are included in respective encapsulants that have been used to encapsulate LED chips of respective samples of a group of LED chips within respective LED test packages; based on determined mathematical relationships and correlations associated with the varying, including a first amount of the non-visible light converting phosphor and a second amount of the visible light converting phosphor in an encapsulant; and encapsulating, using the encapsulant, a manufacturing portion of the group of LED chips within respective LED packages to facilitate categorization of the respective LED packages into a manufacturing bin represented by a defined target LED package light output intensity and a defined target LED package light output color coordinate.

20 Claims, 10 Drawing Sheets

Related U.S. Application Data division of application No. 16/541,584, filed on Aug. 15, 2019, now abandoned, which is a continuation-in-part of application No. 15/797,843, filed on Oct. 30, 2017, now abandoned.

(56) References Cited

U.S. PATENT DOCUMENTS

| | | | |
|---|---|---|---|
| 6,890,085 | B2 | 5/2005 | Hacker |
| 7,038,370 | B2 | 5/2006 | Mueller-Mach et al. |
| 7,083,302 | B2 | 8/2006 | Chen et al. |
| 7,943,941 | B2 | 5/2011 | Shimizu et al. |
| 8,299,701 | B2 | 10/2012 | Kolodin et al. |
| 8,685,762 | B2 | 4/2014 | Shimizu et al. |
| 8,829,780 | B2 | 9/2014 | Sakuta et al. |
| 8,890,403 | B2 | 11/2014 | Sakuta et al. |
| 9,647,181 | B2 | 5/2017 | Ishizaki |
| 9,905,736 | B2 | 2/2018 | Seki et al. |
| 9,954,145 | B2 | 4/2018 | Radkov et al. |
| 9,985,182 | B2 | 5/2018 | Watanabe et al. |
| 10,468,564 | B1 | 11/2019 | Zhao et al. |
| 2008/0180948 | A1 | 7/2008 | Yoon et al. |
| 2013/0234584 | A1* | 9/2013 | Hattori ................... H05B 33/12 313/503 |
| 2016/0104820 | A1* | 4/2016 | Lim ................. C09K 11/77348 257/98 |
| 2016/0276549 | A1 | 9/2016 | Yamashita et al. |
| 2018/0287019 | A1 | 10/2018 | Hashimoto et al. |
| 2019/0123246 | A1 | 4/2019 | Low et al. |
| 2020/0220053 | A1* | 7/2020 | Schmidt ............... C09K 11/645 |

OTHER PUBLICATIONS

Office Action mailed Nov. 20, 2018 for U.S. Appl. No. 15/797,843, 14 pages.

Office Action mailed Apr. 18, 2019 for U.S. Appl. No. 15/797,843, 9 pages.

Office Action mailed May 24, 2019 for U.S. Appl. No. 15/797,843, 11 pages.

Office Action mailed Oct. 9, 2020 for U.S. Appl. No. 15/797,843, 10 pages.

Office Action mailed Mar. 26, 2021 for U.S. Appl. No. 15/797,843, 9 pages.

Office Action mailed Jun. 10, 2022 for U.S. Appl. No. 15/797,843, 6 pages.

Office Action mailed Oct. 16, 2020 for U.S. Appl. No. 16/541,584, 20 pages.

Office Action mailed May 26, 2021 for U.S. Appl. No. 16/541,584, 10 pages.

Office Action mailed Oct. 28, 2021 for U.S. Appl. No. 16/541,584, 8 pages.

Office Action mailed Apr. 22, 2022 for U.S. Appl. No. 16/541,584, 9 pages.

Office Action mailed Jul. 3, 2023 for U.S. Appl. No. 17/985,048, 16 pages.

Office Action mailed Jul. 5, 2023 for U.S. Appl. No. 17/891,965, 15 pages.

* cited by examiner

100

Figure 3:
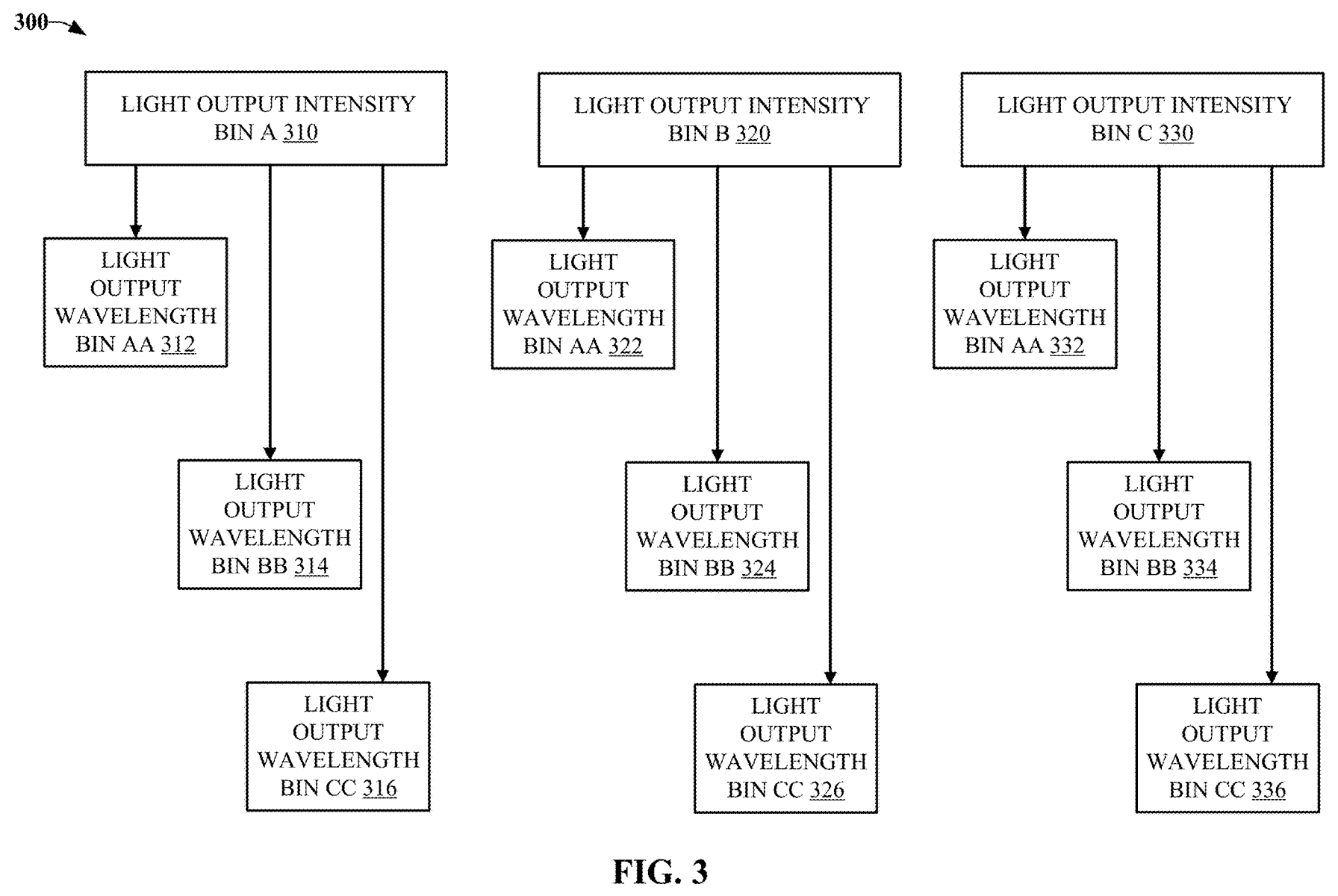

300

LIGHT OUTPUT INTENSITY BIN C 330

LIGHT OUTPUT WAVELENGTH BIN AA 332

LIGHT OUTPUT WAVELENGTH BIN BB 334

LIGHT OUTPUT WAVELENGTH BIN CC 336

LIGHT OUTPUT INTENSITY BIN B 320

LIGHT OUTPUT WAVELENGTH BIN AA 322

LIGHT OUTPUT WAVELENGTH BIN BB 324

LIGHT OUTPUT WAVELENGTH BIN CC 326

LIGHT OUTPUT INTENSITY BIN A 310

LIGHT OUTPUT WAVELENGTH BIN AA 312

LIGHT OUTPUT WAVELENGTH BIN BB 314

LIGHT OUTPUT WAVELENGTH BIN CC 316

| Package | Cup size: Dia 2.4mm Depth 0.8mm | | Cup size: 1.5x1.0mm Depth: 0.7mm | |
|---|---|---|---|---|
| Chip type | InGaN | | | |
| Wafer protocol | 165-180mcd, 457.5-460nm | | 165-180mcd, 457.5-460nm | |
| Ref. current | 20mA | | 20mA | |
| Weight % (Non-visible Phosphor) | Delta IV (Relative %) | Delta WL, nm | Delta IV (Relative %) | Delta WL, nm |
| 0 | 100 | 0 | 100 | 0 |
| 2 | 91 | 0.15 | 90 | 0.16 |
| 4 | 83 | 0.29 | 81 | 0.32 |
| 6 | 74 | 0.44 | 71 | 0.48 |
| 8 | 66 | 0.58 | 62 | 0.64 |
| 10 | 57 | 0.73 | 52 | 0.80 |
| 12 | 49 | 0.88 | 43 | 0.96 |
| 14 | 40 | 1.02 | 33 | 1.12 |

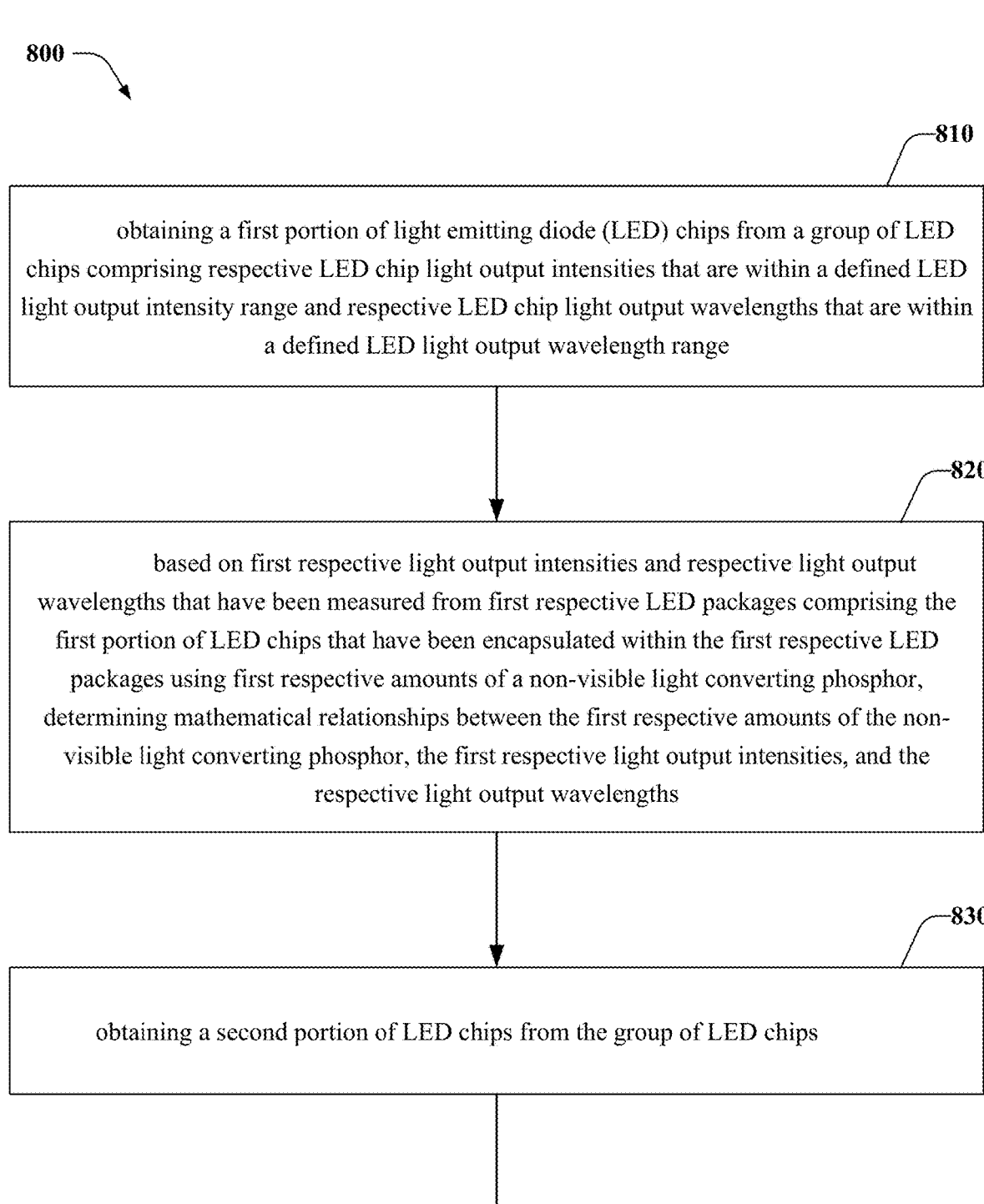

800 —

810 obtaining a first portion of light emitting diode (LED) chips from a group of LED chips comprising respective LED chip light output intensities that are within a defined LED light output intensity range and respective LED chip light output wavelengths that are within a defined LED light output wavelength range

820 based on first respective light output intensities and respective light output wavelengths that have been measured from first respective LED packages comprising the first portion of LED chips that have been encapsulated within the first respective LED packages using first respective amounts of a non-visible light converting phosphor, determining mathematical relationships between the first respective amounts of the non-visible light converting phosphor, the first respective light output intensities, and the respective light output wavelengths

830 obtaining a second portion of LED chips from the group of LED chips

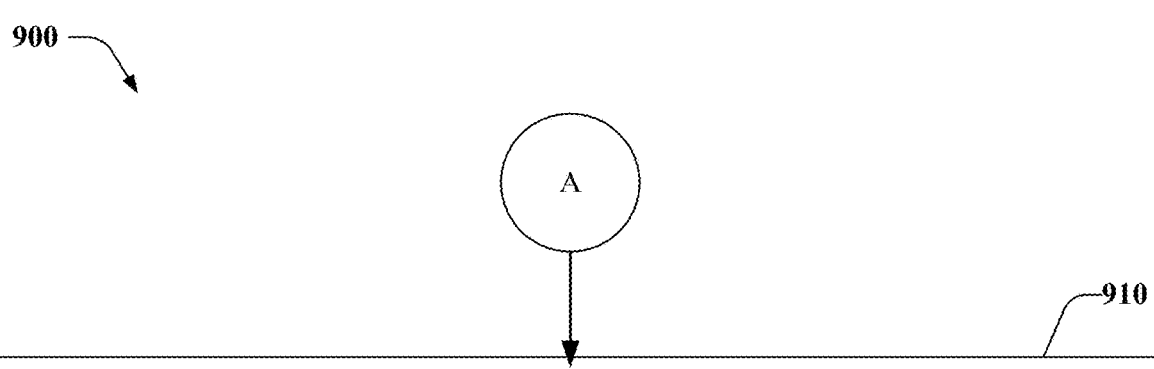

910 based on second respective light output intensities and respective light output color coordinates that have been measured from second respective LED packages comprising the second portion of LED chips that have been encapsulated within the second respective LED packages using second respective amounts of a visible light converting phosphor and a selected amount of the non-visible light converting phosphor that has been selected, using the mathematical relationships, to correspond to a defined light output intensity, correlating the second respective amounts of the visible light converting phosphor to the respective light output color coordinates

920 obtaining a third portion of LED chips from the group of LED chips

930

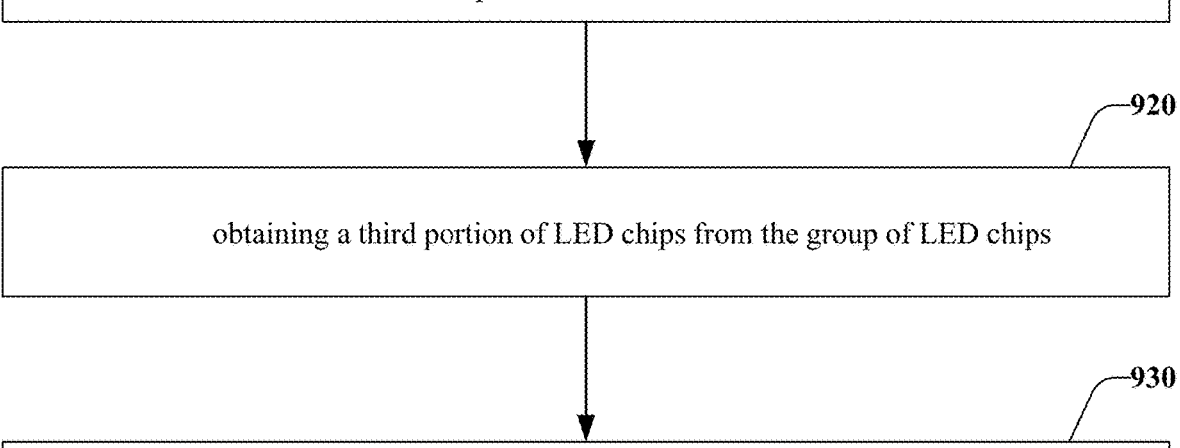

based on the mathematical relationships and the correlating, encapsulating, within third respective LED packages, the third portion of LED chips with a first amount of the non-visible light converting phosphor that has been determined to correspond to a defined target LED package light output intensity of a manufactured LED package and a second amount of the visible light converting phosphor that has been determined to correspond to a defined target LED package light output color coordinate of the manufactured LED package to facilitate classification of the third respective LED packages into a manufacturing bin represented by the defined target LED package light output intensity and the defined target LED package light output color coordinate

FIG. 9

1000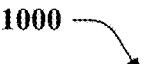

┌─────────────────────────────────────────────────────────────────────┐ ┌1010
│ obtaining an LED chip from a group of LED chips comprising respective light │
│ output intensities that are within a defined intensity range of LED chip light output │
│ intensities and respective light output wavelengths that are within a defined range of │
│ LED chip light output wavelengths │
└─────────────────────────────────────────────────────────────────────┘

┌─────────────────────────────────────────────────────────────────────┐ ┌1020
│ mounting the LED chip on an LED package and electrically connecting, via │
│ wires, the LED chip to respective lead frames of the LED package │
└─────────────────────────────────────────────────────────────────────┘

┌─────────────────────────────────────────────────────────────────────┐ ┌1030
│ based on a light output intensity of the respective light output intensities │
│ corresponding to the LED chip and a light output wavelength of the respective light │
│ output wavelengths corresponding to the LED chip, │
│ encapsulating, within the LED package, the LED chip with a phosphor │
│ material comprising a defined visible light converting phosphor amount of a │
│ visible light converting phosphor and a defined non-visible light converting │
│ phosphor amount of a non-visible light converting phosphor to facilitate │
│ generation, via the LED package, of an LED package light output comprising a │
│ defined LED package light output intensity and a defined LED package light │
│ output color coordinate, and │
│ disposing the LED package in a manufacturing bin comprising binning │
│ parameters representing the defined LED package light output intensity and the defined │
│ LED package light output color coordinate, in which the visible light converting │
│ phosphor emits first electromagnetic radiation in a visible light spectrum, and in which │
│ the non-visible light converting phosphor emits second electromagnetic radiation in a │
│ non-visible light spectrum │
└─────────────────────────────────────────────────────────────────────┘

FIG. 10

LIGHTING SYSTEMS AND ASSOCIATED METHODS OF COMBINING VISIBLE AND NON-VISIBLE LIGHT CONVERTING PHOSPHOR

CROSS-REFERENCE TO RELATED APPLICATIONS

The subject patent application is a continuation-in-part of, and claims priority to, U.S. patent application Ser. No. 17/891,965, filed on Aug. 19, 2022, and entitled "LIGHTING SYSTEMS AND ASSOCIATED METHODS COMBINING VISIBLE AND NON-VISIBLE LIGHT CONVERTING PHOSPHOR", which is a divisional of, and claims priority to, U.S. patent application Ser. No. 16/541,584, filed Aug. 15, 2019, and entitled "LIGHTING SYSTEMS AND ASSOCIATED METHODS COMBINING VISIBLE AND NON-VISIBLE LIGHT CONVERTING PHOSPHOR", which is a continuation-in-part of, and claims priority to, U.S. patent application Ser. No. 15/797,843, filed Oct. 30, 2017, and entitled "LIGHTING SYSTEMS AND METHODS COMBINING VISIBLE AND NON-VISIBLE LIGHT CONVERTING PHOSPHOR", which claims priority to Malaysian Patent Application Serial No. P12017704026, filed Oct. 25, 2017, the entirety of which applications are hereby incorporated by reference herein.

TECHNICAL FIELD

The subject disclosure generally relates to embodiments for lighting systems and methods of combining visible and non-visible light converting phosphor.

BACKGROUND

Generally, light emitting diodes (LEDs) are used in a broad range of industrial applications, primarily due to multiple advantages of LEDs including, but not limited to, energy efficiency, low power consumption, small size, durability, long life, low heat generation, and the like.

During manufacturing and production of LEDs, LED manufacturers focus a majority of their efforts on the testing and quality control of LEDs. Consequently, it is common to sort the LEDs as per different criteria, e.g., light output color (wavelength), light output brightness or intensity (lumen output), forward voltage, and the like. This process of sorting LEDs is generally known as binning, e.g., partitioning the LEDs into groups of different output colors and intensities. The criterion of binning is commonly known as binning parameters.

A main goal of LED manufacturers is to make the binning process more efficient. In most applications, multiple LEDs are used and placed side-by-side, e.g., in a display panel. Accordingly, it is important that LEDs from the same bin, e.g., corresponding to a similar light output color and intensity, are utilized to ensure uniformity in the display panel; otherwise, LEDs that are selected from different bins corresponding to different light output colors and intensities and that are placed side-by-side in a display panel will result in a non-uniform appearance of the display panel.

A challenge facing conventional LED manufacturers is not being able to reduce a number of bins during the production of LEDs—due to variations in the production of LED chips, it is not possible to produce sufficiently similar LEDs in high volume.

BRIEF DESCRIPTION OF THE DRAWINGS

Non-limiting embodiments of the subject disclosure are described with reference to the following Figures, in which like reference numerals refer to like parts throughout the various views unless otherwise specified:

FIG. 3 illustrates a block diagram of bins of LED chips comprising respective light output intensities and respective light output wavelengths, in accordance with various example embodiment(s);

FIGS. 8-9 illustrate flow charts of a method associated with process(es) for manufacturing LED packages comprising respective LED chips that have been encapsulated with respective phosphor materials comprising visible and non-visible light converting phosphor, in accordance with various example embodiment(s); and FIG. 10 illustrates a flow chart of a method associated with process(es) for manufacturing LED packages comprising respective LED chips that have been encapsulated with respective phosphor materials comprising visible and non-visible light converting phosphor, in accordance with various example embodiment(s).

DETAILED DESCRIPTION

Figure 1:
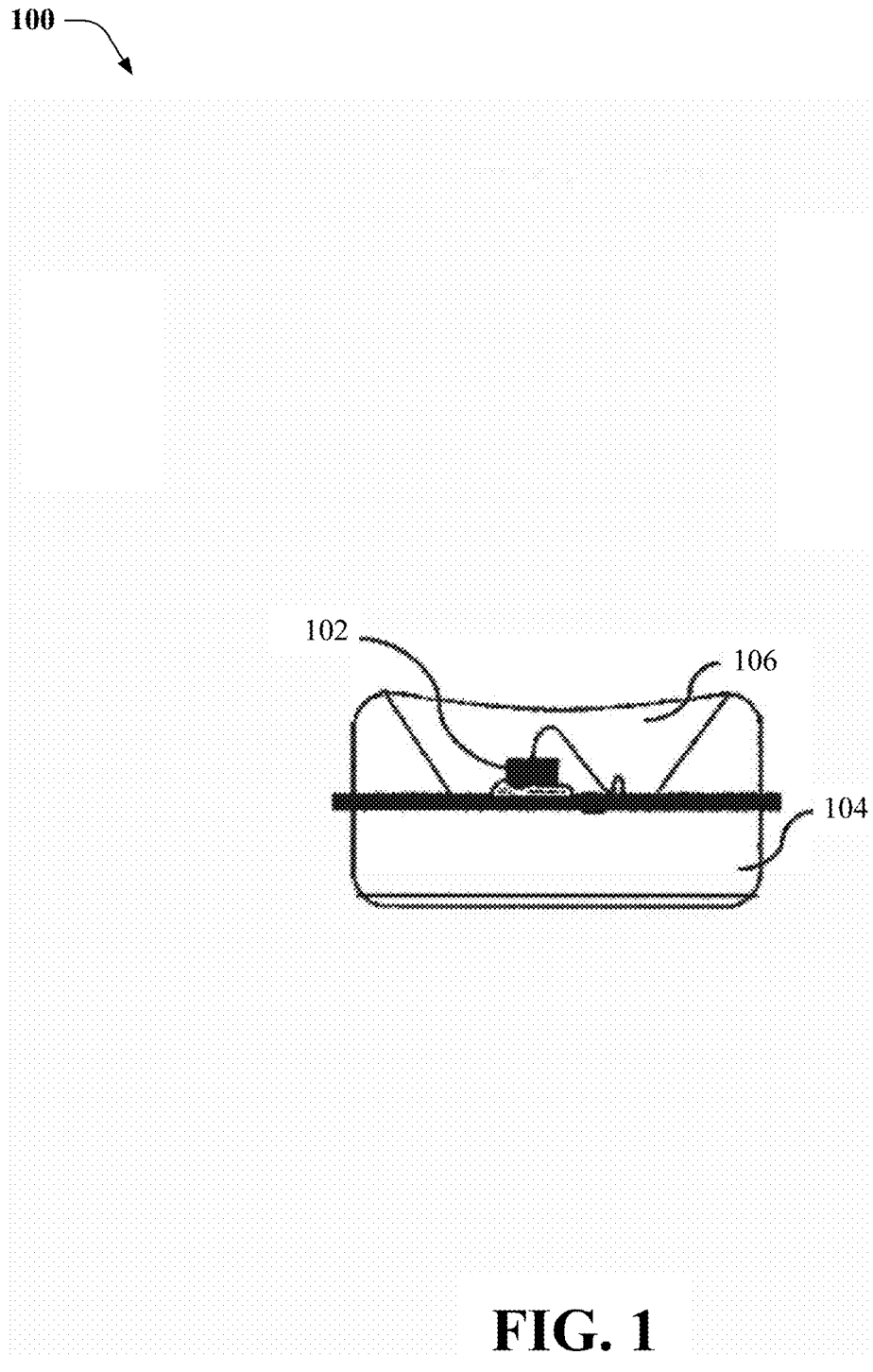
FIG. 1 illustrates a block diagram of a lighting system comprising an LED package that comprises an LED chip that has been encapsulated with a phosphor material comprising visible and non-visible light converting phosphor, in accordance with various example embodiment(s)

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, conventional LED manufacturers are not able to reduce a number of bins during the production of LEDs due to variations in production of LED chips. In various embodiment(s) described herein, method(s)/ process(es) for manufacturing LED packages combine visible and non-visible light converting phosphor used to encapsulate LED chips within respective LED packages to limit a number of bins of such packages during production— the visible light converting phosphor converting visible light from one wavelength/light output to another visible light of a different wavelength/light output, and the non-visible light converting phosphor converting visible light to non-visible wavelengths like infrared or ultraviolet, e.g., a non-visible light range.

For example, in embodiment(s), a method, e.g., of manufacturing LED packages and/or lighting systems, comprises: obtaining respective samples of a group of LED chips comprising respective LED chip light output intensities that are within a defined LED light output intensity range and respective LED chip light output wavelengths that are within a defined LED light output wavelength range; in response to varying respective amounts of a non-visible light converting phosphor and respective amounts of a visible light converting phosphor that are included in respective encapsulants that have been used to encapsulate LED chips of the respective samples within respective LED test packages, determining mathematical relationships between the respective amounts of the non-visible light converting phosphor and respective measured LED package light output intensities of first respective LED test packages of the respective LED test packages, and determining correlations between the respective amounts of the visible light converting phosphor and respective measured LED package light output color coordinates of second respective LED test packages of the respective LED test packages.

The method further comprises: based on the determined mathematical relationships and the determined correlations, selecting a first amount of the respective amounts of the non-visible light converting phosphor that has been determined, based on the determined mathematical relationships, to correspond to a measured LED package light output intensity of the respective measured LED package light output intensities that represents a defined target LED package light output intensity of a manufactured LED package, and selecting a second amount of the respective amounts of the visible light converting phosphor that has been determined, based on the determined correlations, to correspond to a measured LED package light output color coordinate of the respective measured LED package light output color coordinates that represents a defined target LED package light output color coordinate of the manufactured LED package.

Further, the method comprises: in response to including the first amount of the non-visible light converting phosphor and the second amount of the visible light converting phosphor in an encapsulant, encapsulating, using the encapsulant, a manufacturing portion of the group of LED chips within respective LED packages to facilitate categorization of the respective LED packages into a manufacturing bin represented by the defined target LED package light output intensity and the defined target LED package light output color coordinate.

In other embodiment(s), a method, e.g., of manufacturing LED packages and/or lighting systems, comprises: obtaining a first portion of LED chips from a group of LED chips comprising respective LED chip light output intensities that are within a defined LED light output intensity range and respective LED chip light output wavelengths that are within a defined LED light output wavelength range; and based on first respective light output intensities and respective light output wavelengths that have been measured from first respective LED packages comprising the first portion of LED chips that have been encapsulated within the first respective LED packages using first respective amounts of a non-visible light converting phosphor, determining mathematical relationships between the first respective amounts of the non-visible light converting phosphor, the first respective light output intensities, and the respective light output wavelengths.

The method further comprises: obtaining a second portion of LED chips from the group of LED chips; and based on second respective light output intensities and respective light output color coordinates that have been measured from second respective LED packages comprising the second portion of LED chips that have been encapsulated within the second respective LED packages using second respective amounts of a visible light converting phosphor and a selected amount of the non-visible light converting phosphor that has been selected, using the mathematical relationships, to correspond to a defined light output intensity, correlating the second respective amounts of the visible light converting phosphor to the respective light output color coordinates.

Further, the method comprises: obtaining a third portion of LED chips from the group of LED chips; and based on the mathematical relationships and the correlating, encapsulating, within third respective LED packages, the third portion of LED chips with a first amount of the non-visible light converting phosphor that has been determined to correspond to a defined target LED package light output intensity of a manufactured LED package and a second amount of the visible light converting phosphor that has been determined to correspond to a defined target LED package light output color coordinate of the manufactured LED package to facilitate classification of the third respective LED packages into a manufacturing bin represented by the defined target LED package light output intensity and the defined target LED package light output color coordinate.

In yet other embodiment(s), a method, e.g., of manufacturing LED packages and/or lighting systems, comprises: obtaining an LED chip from a group of LED chips comprising respective light output intensities that are within a defined intensity range of LED chip light output intensities and respective light output wavelengths that are within a defined range of LED chip light output wavelengths; and mounting the LED chip on an LED package and electrically connecting, via wires, the LED chip to respective lead frames of the LED package.

Further, the method comprises: based on a light output intensity of the respective light output intensities corresponding to the LED chip and a light output wavelength of the respective light output wavelengths corresponding to the LED chip, encapsulating, within the LED package, the LED chip with a phosphor material comprising a defined visible light converting phosphor amount of a visible light converting phosphor and a defined non-visible light converting phosphor amount of a non-visible light converting phosphor to facilitate generation, via the LED package, of an LED package light output comprising a defined LED package light output intensity and a defined LED package light output color coordinate, and disposing the LED package in a manufacturing bin comprising binning parameters representing the defined LED package light output intensity and the defined LED package light output color coordinate, in which the visible light converting phosphor emits first electromagnetic radiation in a visible light spectrum, and in which the non-visible light converting phosphor emits second electromagnetic radiation in a non-visible light spectrum.

FIG. 1 illustrates a block diagram (100) of a lighting system comprising an LED package (104) that comprises an LED chip (102) that has been mounted on the LED package, and that has been encapsulated with a phosphor material (106) comprising a first converting material (e.g., visible light converting phosphor) and a second converting material (e.g., non-visible light converting phosphor), in accordance with various example embodiment(s). In this regard, the spectral output and/or appearance of the lighting system, e.g., of the LED package, is dependent upon a combination of the first converting material and the second converting material.

In embodiment(s), the first converting material is a phosphor material that emits electromagnetic radiation in the visible light spectrum, and the second converting material is a phosphor material that emits electromagnetic radiation in the non-visible light spectrum. Those of ordinary skill in the art of manufacturing LED lighting devices (e.g., LED chips, LED packages, and the like) will appreciate that the phosphor material can contain one or more types of phosphor. As used herein, phosphor refers to any material that converts wavelengths of light irradiating it, is fluorescent, and/or is phosphorescent.

Figure 2:
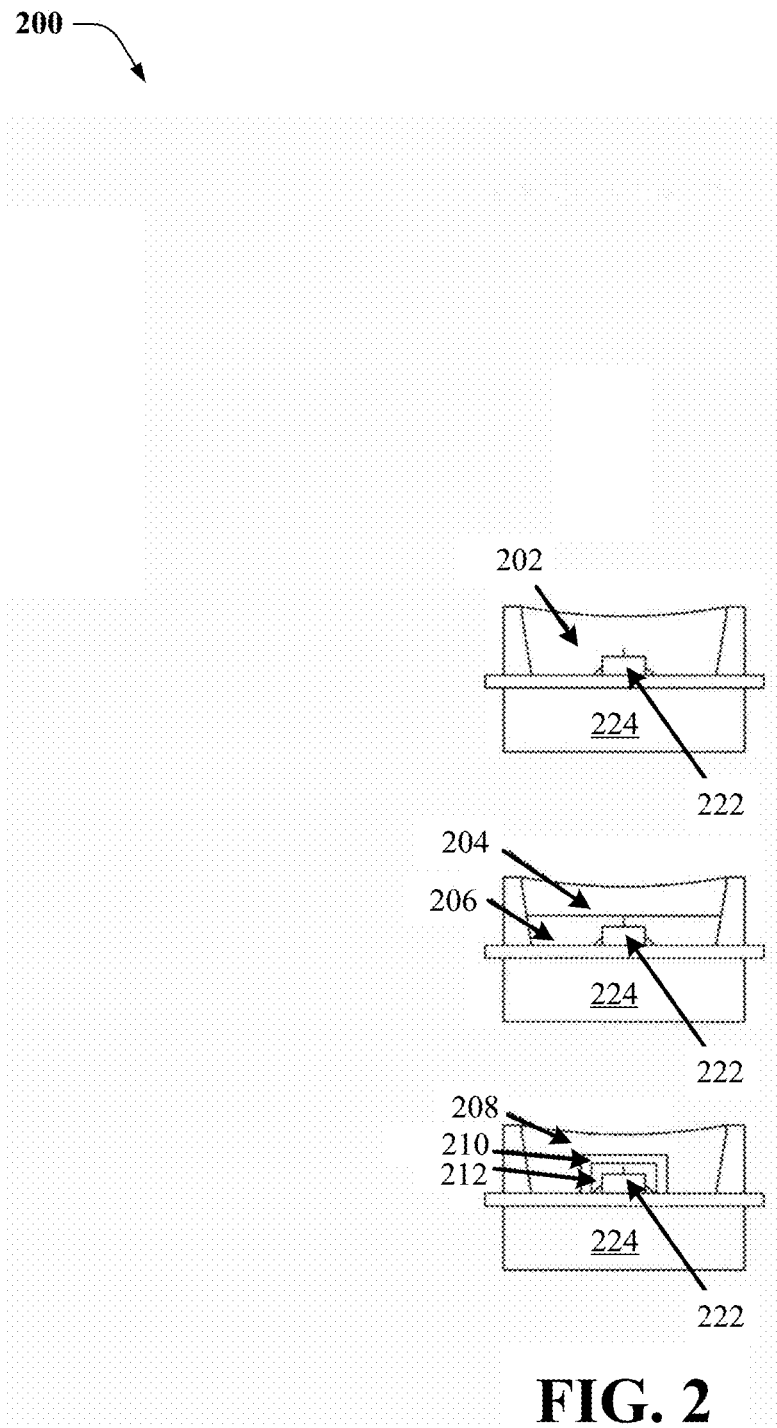
FIG. 2 illustrates a block diagram of respective lighting systems comprising LED packages that comprise respective LED chips that have been encapsulated with respective phosphor materials, in accordance with various example embodiment(s).

FIG. 2 illustrates a block diagram (200) of respective lighting systems comprising LED packages (224) that comprise respective LED chips (222) that have been encapsulated with respective phosphor materials (202, 204, 206, 208, 210, 212), in accordance with various example embodiment(s). As illustrated by FIG. 2, material 202 comprises a combination of a non-visible light converting phosphor material and a visible light converting phosphor material; material 204 comprises a visible light converting phosphor material; material 206 comprises a non-visible light converting phosphor material; material 208 comprises a clear material; material 210 comprises a visible light converting phosphor material; and material 212 comprises a non-visible light converting phosphor material. In this regard, in various embodiment(s), different types of materials (e.g., 202, 204, 206, 208, 210, 212) can be utilized to encapsulate an LED chip.

In embodiment(s), a first quantity/amount of the first converting material can be varied to derive a desired/specified/defined color/target color of an LED package. In other embodiment(s), a second quantity/amount of the second converting material absorbs visible light from an LED chip of the LED package, e.g., converting such light into electromagnetic radiation of a non-visible light range (e.g., non-visible light)—thereby reducing a light output intensity/brightness/lumen output of the LED package. As a result, the conversion of light into non-visible light does not significantly influence an output color, e.g., light output wavelength, of the LED package; therefore, it is convenient to use the second converting material as a means to vary and control the light output intensity/brightness/lumen output of the LED package.

Referring now to FIGS. 3-7, in embodiment(s), a method, e.g., of manufacturing, LED packages includes combining respective amounts of visible and non-visible light converting phosphor in respective materials/encapsulants; and encapsulating, using the respective materials/encapsulants, respective LED chips within respective LED packages to limit a number of bins including the respective LED packages.

FIG. 3. Illustrates a block diagram (300) of bins of LED chips comprising respective light output intensities and respective light output wavelengths—the LED chips supplied by/obtained from an LED chip supplier/manufacturer.

In embodiment(s), the LED chips comprise a blue LED chip or an ultraviolet (UV) LED chip.

As illustrated by FIG. 3, respective portions of the LED chips correspond to LED chip light output intensity bins A (310), B (320), and C (330). In this regard, LED chips of each LED light output intensity bin are further partitioned into (or comprise) LED chip light output wavelength bins, e.g., LED chips of light output intensity bin A are partitioned into (or comprise) light output wavelength bins AA (312), BB (314), and CC (316); LED chips of light output intensity bin B are partitioned into (or comprise) light output wavelength bins AA (322), BB (324), and CC (326); and LED chips of light output intensity bin C are partitioned into (or comprise) light output wavelength bins AA (332), BB (334), and CC (336).

Figure 4:
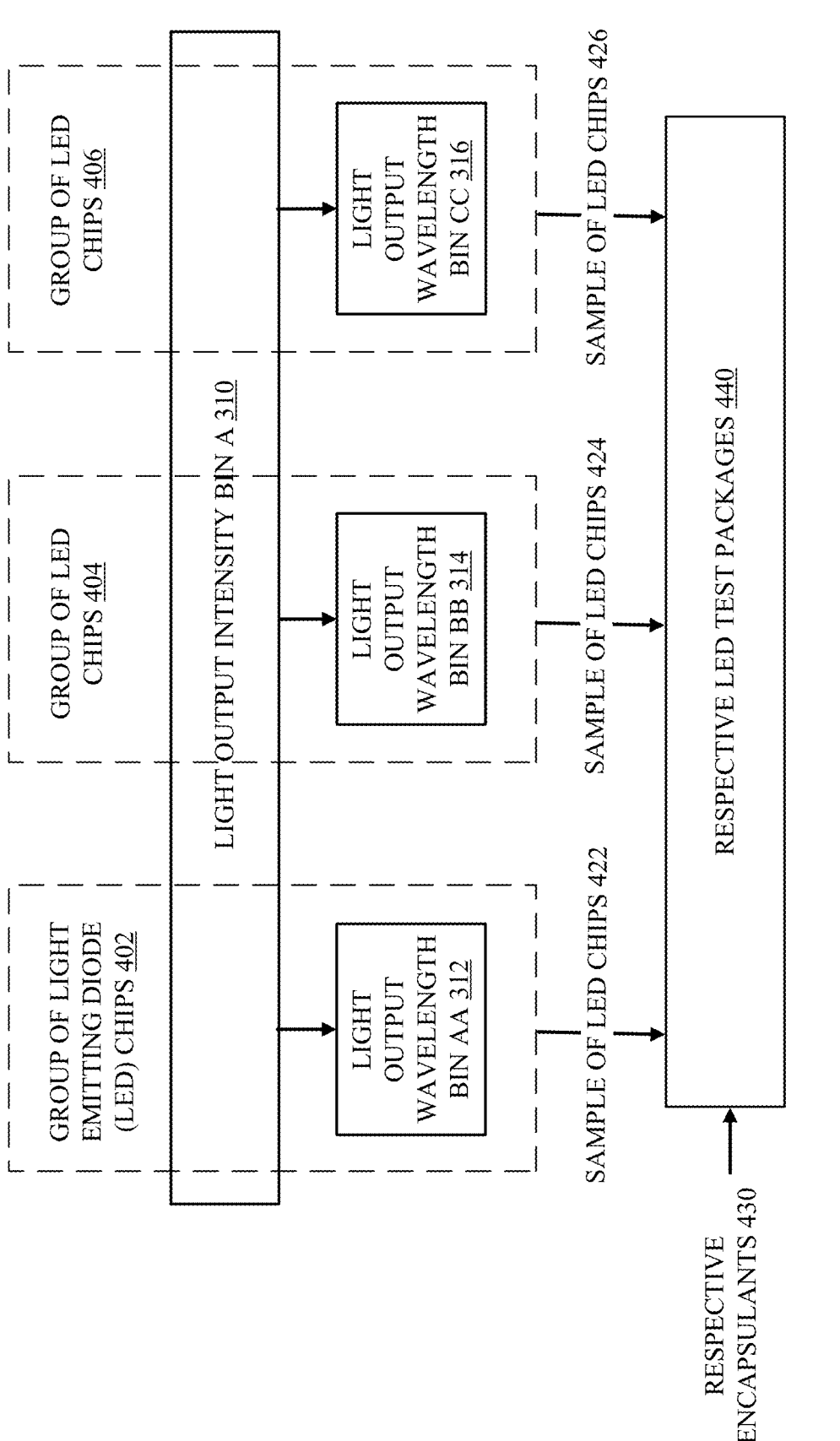
FIG. 4 illustrates a block diagram associated with process(es) for manufacturing LED packages comprising respective LED chips that have been encapsulated with respective phosphor materials comprising visible and non-visible light converting phosphor, in accordance with various example embodiment(s)

As illustrated by FIG. 4, samples of LED chips (e.g., 422, 424, 426) are obtained from respective groups of LED chips (e.g., 402, 404, 406) corresponding to light output intensity bin A. In this regard, in embodiment(s), the method comprises obtaining respective samples (422) of a group of LED chips (402) comprising respective LED chip light output intensities that are within a defined LED light output intensity range (e.g., corresponding to light output intensity bin A) and respective LED chip light output wavelengths that are within a defined LED light output wavelength range (e.g., corresponding to light output wavelength bin AA of light output intensity bin A).

In turn, a first sample of the respective samples, e.g., 240 pieces of LED chips, are mounted on a first portion of LED test packages, e.g., 240 LED test packages, of respective LED test packages 440; and respective LED chips of the first sample are electrically connected, via respective wires, to respective lead frames of the first portion of LED test packages.

Further, the first portion of LED test packages are split into a defined number of groups (e.g., split into 8 groups—each group containing 30 LED test packages), and each group is encapsulated with an encapsulant (e.g., of respective encapsulants 430) that is mixed with a defined weight percentage (%) of non-visible light converting phosphor. For example, each weight percentage of 8 different weight percentages of the non-visible light converting phosphor, e.g., 0%, 2%, 4%, 6%, 8%, 10%, 12%, and 14%, is cast and/or encapsulated into 30 packages of one of the 8 groups.

In this regard, 30 LED chips of one of the 8 groups are encapsulated with 0% weight percentage of the non-visible light converting phosphor; 30 LED chips of another one of the 8 groups are encapsulated with 2% weight percentage of the non-visible light converting phosphor; and so on.

Figure 5:
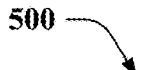
FIG. 5 illustrates a block diagram of a table displaying mathematical relationships between different weight percentages of a non-visible light converting phosphor material that have been added to respective encapsulants used to encapsulate respective LED chips within respective LED test packages, changes in light output intensity of the LED test packages from a defined 100% light output intensity of such packages, and changes in light output wavelength of the LED test packages from a light output wavelength corresponding to the defined 100% LED light output intensity, in accordance with various example embodiment(s)

In turn, the first portion of LED test packages are turned on/activated, e.g., individually, and respective LED package light output intensities and respective LED package light output wavelengths of the first portion of LED test packages are measured, e.g., using a spectrometer. Further, as illustrated by FIG. 5, the different weight percentages of non-visible light converting phosphor material (e.g., "Weight % (Non-visible Phosphor)") that have been used to encapsulate respective LED chips within respective LED test packages of the first sample, changes in light output intensity of the LED test packages from a defined 100% light output intensity of such packages (e.g., "Delta IV (Relative %)"), and changes in light output wavelength of the LED test packages from a light output wavelength corresponding to the defined 100% LED light output intensity (e.g., "Delta WL, nm") are included/plotted in a chart/table (500).

In embodiment(s), respective values of the changes in light output intensity and light output wavelength are average values of measurements that have been performed on 30 pieces of LED test packages that have been encapsulated with a particular weight percentage of the non-visible light converting phosphor.

Based on the respective LED package light output intensities and respective LED package light output wavelengths that have been measured, mathematical relationships between the respective amounts of the non-visible light converting phosphor and respective measured LED package light output intensities of the first portion of LED test packages are determined. In this regard, in embodiment(s), the following linear equation can be derived from measurements included/plotted in chart/table 500:

$$Y=-mX+C, \text{ in which}$$

Y=Final/desired/target LED light output intensity/brightness of an LED package, −mX=LED light output intensity/brightness loss with weight percentage (%) of non-visible phosphor that has been included in an encapsulant of the LED package, and C=Initial LED light output intensity/brightness of the LED package.

A second sample of the respective samples (e.g., 120 pieces of LED chips) comprising the respective LED chip light output intensities that are within the defined LED light output intensity range corresponding to light output intensity bin A, and comprising the respective LED chip light output wavelengths that are within the defined LED light output wavelength range corresponding to light output wavelength bin AA of light output intensity bin A, are mounted on a second portion of LED test packages, e.g., 120 LED test packages, of respective LED test packages 440; and respective LED chips of the second sample are electrically connected, via respective wires, to respective lead frames of the second portion of LED test packages.

Further, the second portion of LED test packages is split into a defined number of groups (e.g., split into 4 groups—each group containing 30 LED test packages). Each group is encapsulated with an encapsulant (e.g., of respective encapsulants 430) that is mixed with one of 4 defined weight percentages (e.g., 2%, 3%, 4%, and 5%) of visible light converting phosphor, and a defined weight percentage of non-visible light converting phosphor (e.g., which has been selected, using the mathematical relationships, to correspond to a defined light output intensity/defined target light output intensity of an LED package).

In this regard, 30 LED chips of one of the 4 groups are encapsulated with 2% weight percentage of the visible light converting phosphor and the defined weight percentage of non-visible light converting phosphor; 30 LED chips of another one of the 4 groups are encapsulated with 3% weight percentage of the visible light converting phosphor and the defined weight percentage of non-visible light converting phosphor; and so on.

In turn, the second portion of LED test packages are turned on/activated, e.g., individually. Further, respective light output intensities (e.g., corresponding to white light)

Figure 6:
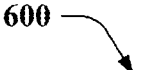
FIG. 6 illustrates a block diagram of an International Commission on Illumination ("CIE") color space chromaticity diagram (illustrated in greyscale) associated with process(es) for manufacturing LED packages comprising respective LED chips that have been encapsulated with respective phosphor materials comprising visible and non-visible light converting phosphor, in accordance with various example embodiment(s)

8 and respective light output color coordinates (e.g., corresponding to a CIE color space chromaticity diagram illustrated in FIG. 6) are measured from the second portion of LED test packages; and the defined weight percentages (e.g., 2%, 3%, 4%, and 5%) of visible light converting phosphor are correlated with the measured respective light output color coordinates and the respective light output intensities.

Figure 7:
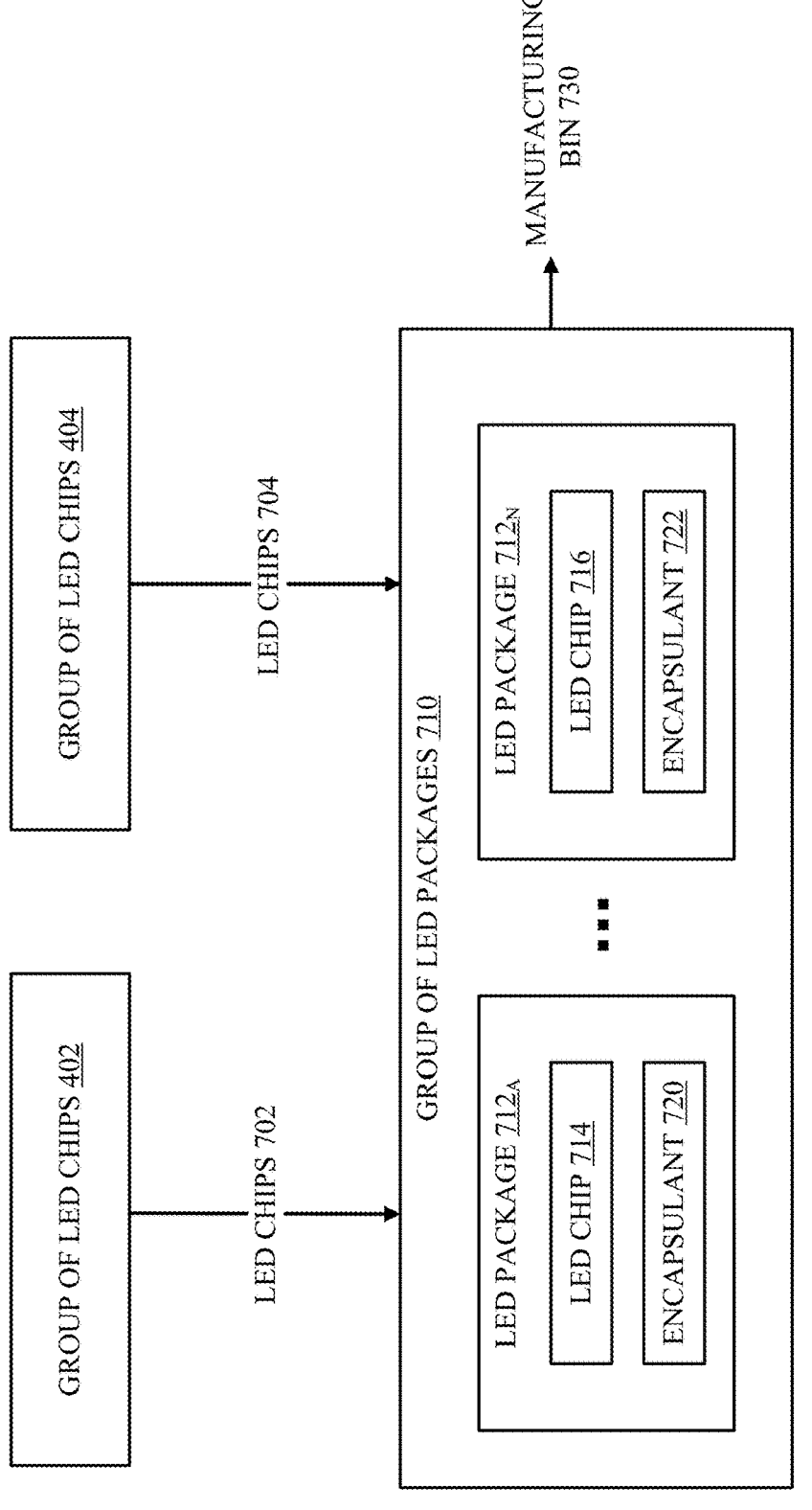
FIG. 7 illustrates another block diagram associated with process(es) for manufacturing LED packages comprising respective LED chips that have been encapsulated with respective phosphor materials comprising visible and non-visible light converting phosphor, in accordance with various example embodiment(s)

Referring now to FIG. 7, a portion of LED chips (702) from the group of LED chips (402) comprising the respective LED chip light output intensities that are within the defined LED light output intensity range corresponding to light output intensity bin A, and comprising the respective LED chip light output wavelengths that are within the defined LED light output wavelength range corresponding to light output wavelength bin AA of light output intensity bin A, are obtained for manufacture of LED packages (e.g., comprising LED package 712$_A$) to be placed/dispersed into a manufacturing bin (e.g., manufacturing bin 730).

Further, the portion of LED chips (e.g., comprising LED chip 714) is mounted on respective LED packages (e.g., comprising LED package 712$_A$) of a group of LED packages 710; and respective wires are electrically connected to respective lead frames of the respective LED packages.

In turn, based on the mathematical relationships and the correlating described above, the portion of LED chips is encapsulated, within the respective LED packages, using an encapsulant (e.g., encapsulant 720) comprising a first amount of the non-visible light converting phosphor that has been determined to correspond to a defined target LED package light output intensity (e.g., a defined target white light output intensity and/or a defined target light output brightness for white light) of a manufactured LED package (e.g., corresponding to manufacturing bin 730), and a second amount of the visible light converting phosphor that has been determined to correspond to a defined target LED package light output color coordinate (e.g., of a defined (e.g., CIE-based) color space) of the manufactured LED package (e.g., corresponding to manufacturing bin 730) to facilitate classification of the respective LED packages into the manufacturing bin (730) represented by the defined target LED package light output intensity and the defined target LED package light output color coordinate.

In embodiment(s), another portion of LED chips (704) from a group of LED chips (404) comprising other respective LED chip light output intensities, which are greater than the respective LED chip light output intensities corresponding to group of LED chip 402, are obtained for manufacture of LED packages (e.g., comprising LED package 712$_N$) to be placed/dispersed into the manufacturing bin (e.g., manufacturing bin 730).

In this regard, the portion of LED chips 704 (e.g., comprising LED chip 716) is mounted on respective LED packages (e.g., comprising LED package 712$_N$) of the group of LED packages 710; and respective wires are electrically connected to respective lead frames of the respective LED packages.

In turn, based on the mathematical relationships and the correlating described above, the portion of LED chips 704 is encapsulated, within the respective LED packages, using an encapsulant (e.g., encapsulant 722) comprising a revised amount of the non-visible light converting phosphor that is greater than the first amount of the non-visible light converting phosphor of encapsulant 720—the revised amount being determined to correspond to the defined target LED package light output intensity (e.g., the defined target white light output intensity and/or the defined target light output brightness for white light) corresponding to manufacturing bin 730.

In other embodiment(s), another portion of LED chips (704) from a group of LED chips (404) comprising other respective LED chip light output intensities, which are less than the respective LED chip light output intensities corresponding to group of LED chip 402, are obtained for manufacture of LED packages (e.g., LED package 712<sub>N</sub>) to be placed/dispersed into the manufacturing bin (e.g., manufacturing bin 730).

In this regard, the portion of LED chips 704 (e.g., comprising LED chip 716) is mounted on respective LED packages (e.g., comprising LED package 712<sub>N</sub>) of the group of LED packages 710; and respective wires are electrically connected to respective lead frames of the respective LED packages.

In turn, based on the mathematical relationships and the correlating described above, the portion of LED chips 704 is encapsulated, within the respective LED packages, using an encapsulant (e.g., encapsulant 722) comprising a revised amount of the non-visible light converting phosphor that is less than the first amount of the non-visible light converting phosphor of encapsulant 720—the revised amount being determined to correspond to the defined target LED package light output intensity (e.g., the defined target white light output intensity and/or the defined target light output brightness for white light) corresponding to manufacturing bin 730.

In yet other embodiment(s), another portion of LED chips (704) from a group of LED chips (404) comprising other respective LED chip light output intensities, which are less than the respective LED chip light output intensities corresponding to group of LED chip 402, are obtained for manufacture of LED packages (e.g., LED package 712<sub>N</sub>) to be placed/dispersed into the manufacturing bin (e.g., manufacturing bin 730).

In this regard, the portion of LED chips 704 (e.g., comprising LED chip 716) is mounted on respective LED packages (e.g., comprising LED package 712<sub>N</sub>) of the group of LED packages 710; and respective wires are electrically connected to respective lead frames of the respective LED packages.

In turn, based on the mathematical relationships and the correlating described above, the portion of LED chips 704 is encapsulated, within the respective LED packages, using an encapsulant (e.g., encapsulant 722) that does not include the non-visible light converting phosphor to facilitate classification/placement of the respective LED packages (e.g., comprising LED package 712<sub>N</sub>) into manufacturing bin 730.

FIGS. 8-10 illustrate methodologies in accordance with the disclosed subject matter. For simplicity of explanation, the methodologies are depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events.

FIGS. 8-9 illustrate flow charts (800, 900) of a method associated with process(es) for manufacturing LED packages comprising respective LED chips that have been encapsulated with respective phosphor materials comprising visible and non-visible light converting phosphor, in accordance with various example embodiment(s).

At 810, a first portion of LED chips is obtained from a group of LED chips comprising respective LED chip light output intensities that are within a defined LED light output intensity range and respective LED chip light output wavelengths that are within a defined LED light output wavelength range.

At 820, based on first respective light output intensities and respective light output wavelengths that have been measured from first respective LED packages comprising the first portion of LED chips that have been encapsulated within the first respective LED packages using first respective amounts of a non-visible light converting phosphor, mathematical relationships between the first respective amounts of the non-visible light converting phosphor, the first respective light output intensities, and the respective light output wavelengths are determined.

At 830, a second portion of LED chips are obtained from the group of LED chips. At 910, based on second respective light output intensities and respective light output color coordinates that have been measured from second respective LED packages comprising the second portion of LED chips that have been encapsulated within the second respective LED packages using second respective amounts of a visible light converting phosphor and a selected amount of the non-visible light converting phosphor that has been selected, using the mathematical relationships, to correspond to a defined light output intensity, the second respective amounts of the visible light converting phosphor are correlated to the respective light output color coordinates.

At 920, a third portion of LED chips are obtained from the group of LED chips. At 930, based on the mathematical relationships and the correlation of the second respective amounts of the visible light converting phosphor to the respective light output color coordinates, the third portion of LED chips are encapsulated, within third respective LED packages, with a first amount of the non-visible light converting phosphor that has been determined to correspond to a defined target LED package light output intensity of a manufactured LED package and a second amount of the visible light converting phosphor that has been determined to correspond to a defined target LED package light output color coordinate of the manufactured LED package to facilitate classification of the third respective LED packages into a manufacturing bin represented by the defined target LED package light output intensity and the defined target LED package light output color coordinate.

FIG. 10 illustrates a flow chart (1000) of a method associated with process(es) for manufacturing LED packages comprising respective LED chips that have been encapsulated with respective phosphor materials comprising visible and non-visible light converting phosphor, in accordance with various example embodiment(s).

At 1010, an LED chip is obtained from a group of LED chips comprising respective light output intensities that are within a defined intensity range of LED chip light output intensities and respective light output wavelengths that are within a defined range of LED chip light output wavelengths.

At 1020, the LED chip is mounted on an LED package and electrically connected, via wires, to respective lead frames of the LED package.

At 1030, based on a light output intensity of the respective light output intensities corresponding to the LED chip and a light output wavelength of the respective light output wavelengths corresponding to the LED chip, the LED chip is encapsulated, within the LED package, with a phosphor material comprising a defined visible light converting phosphor amount of a visible light converting phosphor and a defined non-visible light converting phosphor amount of a non-visible light converting phosphor to facilitate generation, via the LED package, of an LED package light output comprising a defined LED package light output intensity and a defined LED package light output color coordinate.

Further, the LED package is disposed in a manufacturing bin comprising binning parameters representing the defined LED package light output intensity and the defined LED package light output color coordinate, in which the visible light converting phosphor emits first electromagnetic radiation in a visible light spectrum, and in which the non-visible light converting phosphor emits second electromagnetic radiation in a non-visible light spectrum.

Reference throughout this specification to "one embodiment," "an embodiment," "another embodiment", "yet another embodiment", "embodiment(s)", "other "embodiment(s)", and "yet other embodiment(s)" means that a particular feature, structure, or characteristic described in connection with the embodiment is included in at least one embodiment. Thus, the appearances of the phrase "in one embodiment," "in an embodiment," "in another embodiment", "in yet another embodiment", "in embodiment(s)", "in other embodiment(s)", and "in yet other embodiment(s)" in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:

obtaining respective samples of a group of light emitting diode (LED) chips comprising respective LED chip light output intensities that are within a defined LED light output intensity range and respective LED chip light output wavelengths that are within a defined LED light output wavelength range;

in response to varying respective amounts of a non-visible light converting phosphor and respective amounts of a visible light converting phosphor that are included in respective encapsulants that have been used to encapsulate LED chips of the respective samples within respective LED test packages, determining mathematical relationships between the respective amounts of the non-visible light converting phosphor and respective measured LED package light output intensities of first respective LED test packages of the respective LED test packages, and determining correlations between the respective amounts of the visible light converting phosphor and respective measured LED package light output color coordinates of second respective LED test packages of the respective LED test packages;

based on the determined mathematical relationships and the determined correlations, selecting a first amount of the respective amounts of the non-visible light converting phosphor that has been determined, based on the determined mathematical relationships, to correspond to a measured LED package light output intensity of the respective measured LED package light output intensities that represents a defined target LED package light output intensity of a manufactured LED package, and selecting a second amount of the respective amounts of the visible light converting phosphor that has been determined, based on the determined correlations, to correspond to a measured LED package light output color coordinate of the respective measured LED package light output color coordinates that represents a defined target LED package light output color coordinate of the manufactured LED package; and in response to including the first amount of the non-visible light converting phosphor and the second amount of the visible light converting phosphor in an encapsulant, encapsulating, using the encapsulant, a manufacturing portion of the group of LED chips within respective LED packages to facilitate categorization of the respective LED packages into a manufacturing bin represented by the defined target LED package light output intensity and the defined target LED package light output color coordinate.

2. The method of claim 1, further comprising:

mounting respective LED chips of a sample of the respective samples of the group of LED chips on LED test packages of the first respective LED test packages;

electrically connecting, via respective wires, the respective LED chips to respective lead frames of the LED test packages; and encapsulating, using encapsulants of the respective encapsulants comprising respective varied amounts of the non-visible light converting phosphor, the respective LED chips within the LED test packages.

3. The method of claim 2, wherein the encapsulating of the respective LED chips comprises:

including a defined number of different weight percentages of the non-visible light converting phosphor in the encapsulants.

4. The method of claim 3, wherein the determining of the mathematical relationships comprises:

activating the LED test packages;

measuring respective light output intensities of the LED test packages to obtain the respective measured LED package light output intensities;

measuring respective light output wavelengths of the LED test packages to obtain respective measured LED package light output wavelengths;

plotting, via a graph, respective values associated with the respective measured LED package light output intensities, respective values associated with the respective measured LED package light output wavelengths, and respective values of the defined number of different weight percentages of the non-visible light converting phosphor that have been included in the encapsulants and that correspond to the first values; and based on the graph, deriving a linear relationship between the respective values associated with the respective measured LED package light output intensities, the respective values associated with the respective measured LED package light output wavelengths, and the respective values of the defined number of different weight percentages of the non-visible light converting phosphor.

5. The method of claim 4, wherein the linear relationship represents the defined target LED package light output intensity as function of a loss of light output intensity corresponding to a weight percentage of the non-visible light converting phosphor that is included in an encapsulant the encapsulants.

6. The method of claim 1, further comprising:

mounting respective LED chips of a sample of the respective samples of the group of LED chips on LED test packages of the second respective LED test packages;

electrically connecting, via respective wires, the respective LED chips to respective lead frames of the LED test packages; and encapsulating, using encapsulants of the respective encapsulants comprising respective varied amounts of the visible light converting phosphor, the respective LED chips within the LED test packages.

7. The method of claim 6, wherein the encapsulating of the respective LED chips comprises:

including a defined number of different weight percentages of the visible light converting phosphor in the encapsulants.

8. The method of claim 7, wherein the determining of the correlations comprises:

activating the LED test packages;

measuring respective light output color coordinates of the LED test packages to obtain the respective measured LED package light output color coordinates;

correlating respective values of the respective measured LED package light output color coordinates with respective values of the different weight percentages of the visible light converting phosphor that has been included in the encapsulants.

9. The method of claim 1, wherein the group of LED chips comprises at least one of a blue LED chip or an ultraviolet LED chip.

10. The method of claim 1, wherein the defined target LED package light output intensity comprises a defined target light output brightness for white light, and wherein the defined target LED package light output color coordinate comprises an output color coordinate of a defined color space.

11. A method, comprising:

obtaining a first portion of light emitting diode (LED) chips from a group of LED chips comprising respective LED chip light output intensities that are within a defined LED light output intensity range and respective LED chip light output wavelengths that are within a defined LED light output wavelength range;

based on first respective light output intensities and respective light output wavelengths that have been measured from first respective LED packages comprising the first portion of LED chips that have been encapsulated within the first respective LED packages using first respective amounts of a non-visible light converting phosphor, determining mathematical relationships between the first respective amounts of the non-visible light converting phosphor, the first respective light output intensities, and the respective light output wavelengths;

obtaining a second portion of LED chips from the group of LED chips;

based on second respective light output intensities and respective light output color coordinates that have been measured from second respective LED packages comprising the second portion of LED chips that have been encapsulated within the second respective LED packages using second respective amounts of a visible light converting phosphor and a selected amount of the non-visible light converting phosphor that has been selected, using the mathematical relationships, to correspond to a defined light output intensity, correlating the second respective amounts of the visible light converting phosphor to the respective light output color coordinates;

obtaining a third portion of LED chips from the group of LED chips; and based on the mathematical relationships and the correlating, encapsulating, within third respective LED packages, the third portion of LED chips with a first amount of the non-visible light converting phosphor that has been determined to correspond to a defined target LED package light output intensity of a manufactured LED package and a second amount of the visible light converting phosphor that has been determined to correspond to a defined target LED package light output color coordinate of the manufactured LED package to facilitate classification of the third respective LED packages into a manufacturing bin represented by the defined target LED package light output intensity and the defined target LED package light output color coordinate.

12. The method of claim 11, further comprising:

mounting the first portion of LED chips on respective LED packages;

electrically connecting, via respective wires, the first portion of LED chips to respective lead frames of the respective LED packages;

encapsulating, within the respective LED packages, the first portion of LED chips with the first respective amounts of the non-visible light converting phosphor; and measuring the first respective light output intensities and the respective light output wavelengths of the first portion of LED chips that have been encapsulated within the respective LED packages using the first respective amounts of the non-visible light converting phosphor.

13. The method of claim 11, further comprising:

mounting the second portion of LED chips on respective LED packages;

electrically connecting, via respective wires, the second portion of LED chips to respective lead frames of the respective LED packages;

encapsulating, within the respective LED packages, the second portion of LED chips with the second respective amounts of the visible light converting phosphor and the selected amount of the non-visible light converting phosphor; and measuring the second respective light output intensities and the respective light output color coordinates of the second portion of LED chips that have been encapsulated within the respective LED packages using the second respective amounts of the visible light converting phosphor and the selected amount of the non-visible light converting phosphor.

14. The method of claim 11, wherein the group of LED chips is a first group of LED chips, wherein the respective LED chip light output intensities are first respective LED chip light output intensities, and wherein the method further comprises:

obtaining a manufacturing portion of LED chips from a second group of LED chips corresponding to second respective LED chip light output intensities that are greater than the first respective LED chip light output intensities; and encapsulating, within fourth respective LED packages, the manufacturing portion of LED chips with a revised amount of the non-visible light converting phosphor to facilitate classification of the fourth respective LED packages into the manufacturing bin represented by the defined target LED package light output intensity, wherein the revised amount of the non-visible light converting phosphor has been determined to correspond to the second respective LED chip light output intensities, and wherein the revised amount of the non-visible light converting phosphor is greater than the first amount of the non-visible light converting phosphor.

15. The method of claim 11, wherein the group of LED chips is a first group of LED chips, wherein the respective LED chip light output intensities are first respective LED chip light output intensities, and wherein the method further comprises:

obtaining a manufacturing portion of LED chips from a second group of LED chips corresponding to second respective LED chip light output intensities that are less than the first respective LED chip light output intensities; and encapsulating, within fourth respective LED packages, the manufacturing portion of LED chips with a revised amount of the non-visible light converting phosphor to facilitate classification of the fourth respective LED packages into the manufacturing bin represented by the defined target LED package light output intensity, wherein the revised amount of the non-visible light converting phosphor has been determined to correspond to the second respective LED chip light output intensities, and wherein the revised amount of the non-visible light converting phosphor is less than the first amount of the non-visible light converting phosphor.

16. The method of claim 11, wherein the group of LED chips is a first group of LED chips, wherein the respective LED chip light output intensities are first respective LED chip light output intensities, and wherein the method further comprises:

obtaining a manufacturing portion of LED chips from a second group of LED chips corresponding to second respective LED chip light output intensities that are less than the first respective LED chip light output intensities; and encapsulating, within fourth respective LED packages, the manufacturing portion of LED chips without the non-visible light converting phosphor to facilitate classification of the fourth respective LED packages into the manufacturing bin represented by the defined target LED package light output intensity.

17. A method, comprising:

obtaining a light emitting diode (LED) chip from a group of LED chips comprising respective light output intensities that are within a defined intensity range of LED chip light output intensities and respective light output wavelengths that are within a defined range of LED chip light output wavelengths;

mounting the LED chip on an LED package and electrically connecting, via wires, the LED chip to respective lead frames of the LED package;

based on a light output intensity of the respective light output intensities corresponding to the LED chip and a light output wavelength of the respective light output wavelengths corresponding to the LED chip, encapsulating, within the LED package, the LED chip with a phosphor material comprising a defined visible light converting phosphor amount of a visible light converting phosphor and a defined non-visible light converting phosphor amount of a non-visible light converting phosphor to facilitate generation, via the LED package, of an LED package light output comprising a defined LED package light output intensity and a defined LED package light output color coordinate, and disposing the LED package in a manufacturing bin comprising binning parameters representing the defined LED package light output intensity and the defined LED package light output color coordinate, wherein the visible light converting phosphor emits first electromagnetic radiation in a visible light spectrum, and wherein the non-visible light converting phosphor emits second electromagnetic radiation in a non-visible light spectrum.

18. The method of claim 17, wherein the LED chip is a first LED chip, wherein the group of LED chips is a first group of LED chips, wherein the respective light output intensities are first respective light output intensities, wherein the LED package is a first LED package, wherein the phosphor material is a first phosphor material, wherein the defined non-visible light converting phosphor amount is a first defined non-visible light converting phosphor amount, and wherein the method further comprises:

obtaining a second LED chip from a second group of LED chips comprising second respective light output intensities that are greater than the first respective light output intensities; and encapsulating, within a second LED package, the second LED chip with a second phosphor material comprising a second defined non-visible light converting phosphor amount of the non-visible light converting phosphor that is greater than the first defined non-visible light converting phosphor amount to facilitate generation, via the second LED package, of the LED package light output comprising the defined LED package light output intensity.

19. The method of claim 17, wherein the LED chip is a first LED chip, wherein the group of LED chips is a first group of LED chips, wherein the respective light output intensities are first respective light output intensities, wherein the LED package is a first LED package, wherein the phosphor material is a first phosphor material, wherein the defined non-visible light converting phosphor amount is a first defined non-visible light converting phosphor amount, and wherein the method further comprises:

obtaining a second LED chip from a second group of LED chips comprising second respective light output intensities that are less than the first respective light output intensities; and

encapsulating, within a second LED package, the second LED chip with a second phosphor material comprising a second defined non-visible light converting phosphor amount of the non-visible light converting phosphor that is less than the first defined non-visible light converting phosphor amount to facilitate generation, via the second LED package, of the LED package light output comprising the defined LED package light output intensity.

20. The method of claim 17, wherein the LED chip is a first LED chip, wherein the group of LED chips is a first group of LED chips, wherein the respective light output intensities are first respective light output intensities, wherein the LED package is a first LED package, wherein the phosphor material is a first phosphor material, wherein the defined non-visible light converting phosphor amount is a first defined non-visible light converting phosphor amount, and wherein the method further comprises:

obtaining a second LED chip from a second group of LED chips comprising second respective light output intensities that are less than the first respective light output intensities; and encapsulating, within a second LED package, the second LED chip without the non-visible light converting phosphor to facilitate generation, via the second LED package, of the LED package light output comprising the defined LED package light output intensity.

* * * * *